United States Patent

Craft

[15] 3,678,403

[45] July 18, 1972

[54] BALANCED VARIABLE GAIN AMPLIFIER

[72] Inventor: Jack Craft, Somerville, N.J.

[73] Assignee: RCA Corporation

[22] Filed: Aug. 26, 1970

[21] Appl. No.: 66,973

[52] U.S. Cl. ................................330/13, 330/29, 330/38 M

[51] Int. Cl. ..........................................................H03g 3/30

[58] Field of Search .................330/29, 13, 17, 18, 19, 38 R, 330/38 M, 145

[56] References Cited

UNITED STATES PATENTS 3,512,096 5/1970 Nagata et al. ............................330/29

*Primary Examiner*—Roy Lake
*Assistant Examiner*—James B. Mullins
*Attorney*—E. M. Whitacre

[57] ABSTRACT

A balanced variable gain amplifier which can be gain controlled without disturbing the DC output level comprising, but not limited to, a complementary output stage characterized by a high signal-to-noise ratio suitable for fabrication on a monolithic semiconductor chip.

11 Claims, 3 Drawing Figures

INVENTOR.
Jack Craft
BY Martin Sachs
ATTORNEY

PATENTED JUL 18 1972

3,678,403

INVENTOR.
Jack Craft
BY Martin Sachs
ATTORNEY

BALANCED VARIABLE GAIN AMPLIFIER

The present invention relates to variable gain amplifiers and, more specifically, to a balanced variable gain direct current coupled amplifier having a fixed DC output level and comprised of transistors connected in a complementary arrangement which is suitable for fabrication with integrated circuit techniques.

The term integrated circuit as used herein refers to a unitary or monolithic semiconductor structure or chip incorporating the equivalent of a network of interconnected active and passive electrical circuit elements such as transistors, diodes, resistors, capacitors, and the like. The term angle modulation as used herein refers to frequency or phase modulated waves or waves modulated in both frequency and phase and will henceforth be referred to as frequency modulated (FM).

In the design of receivers to be used for the reception of frequency modulation signal waves, various techniques have been utilized to reduce the AM noise modulation recovered from the frequency modulated signal wave envelope. One such technique requires the use of a balanced push-pull intermediate frequency amplifier-limiter used in conjunction with a balanced frequency modulation detector. The output of the balanced frequency modulation detector contributes to the reduction of AM noise more effectively if the signal information at the output of the detector remains a push-pull signal wave and is coupled to a balanced push-pull output amplifier which will also effectively contribute to the AM noise suppression.

An additional desirable feature in an output amplifier is a variable gain capability coupled with a high signal-to-noise ratio which is unaffected by attenuation of the output signal. The present embodiment of the invention has the capability of amplifying an input signal, with variable gain responsive to a control voltage, while maintaining a fixed DC output level.

In accordance with one embodiment of the invention, variable gain amplifiers are arranged in a complementary circuit with the gain of the amplifier responsive to a control voltage, while maintaining a fixed DC output level.

The present invention may be incorporated in a circuit which is fabricated on an integrated circuit chip measuring approximately 80 mils by 80 mils and is a portion of a complete receiver system. The integrated circuit chip may include, but is not limited to, an output amplifier, an intermediate frequency amplifier-limiter, an angle modulation detector, a signal-to-noise or hole detector circuit, a biasing power supply, and a tuning and signal strength circuit.

By way of example, the circuitry of a complete monolithic integrated circuit semiconductor chip having the above elements may be of the type described in copending application Ser. No. 66,945, (RCA 2,898) filed on Aug. 26, 1970, by Jack Avins, which is assigned to the same assignee as the present invention.

A complete understanding of the present invention may be obtained from the following detailed description when taken in conjunction with the accompanying drawings in which.

Figures 1, 2:
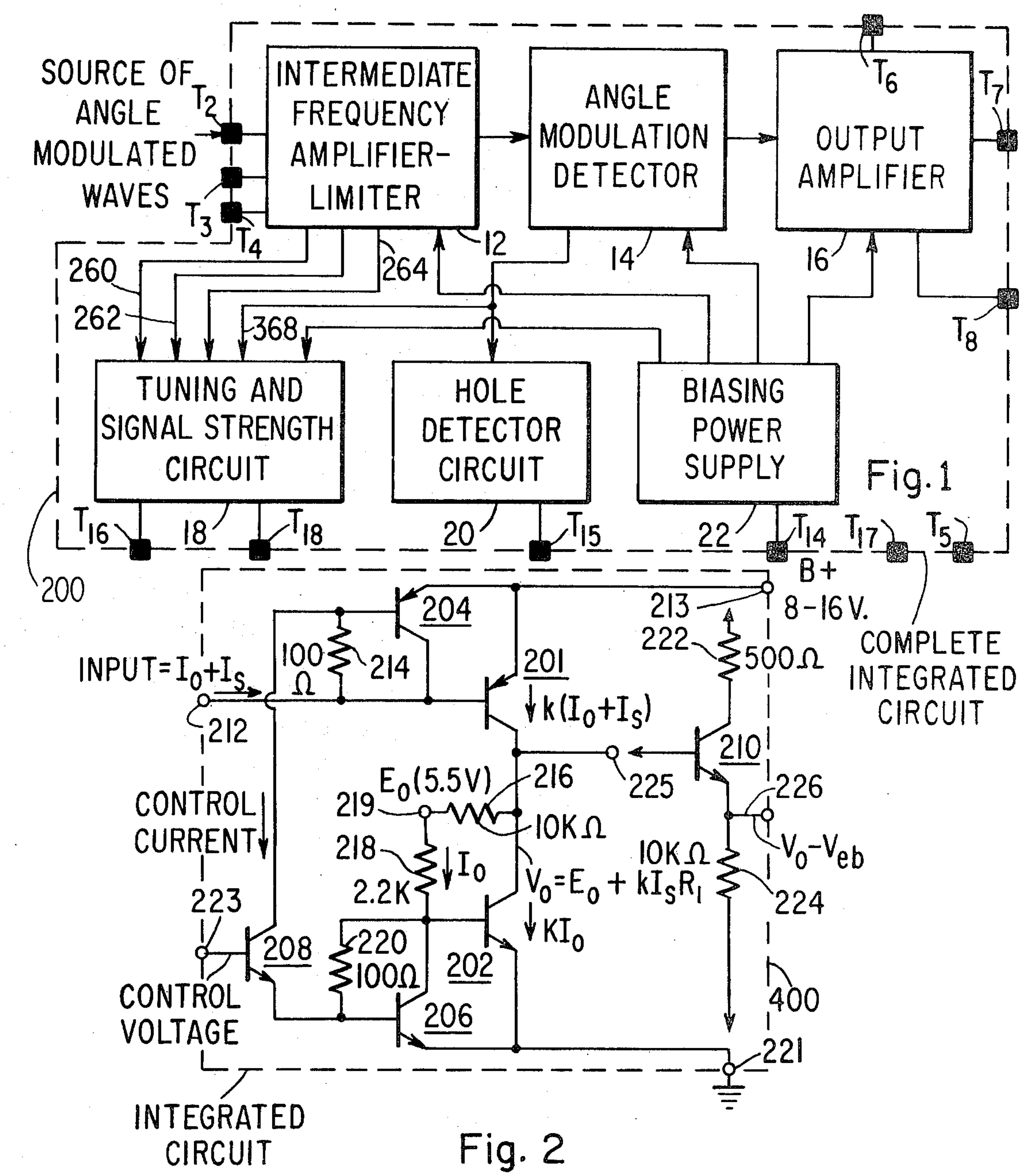
FIG. 1 is a functional block diagram of a monolithic integrated circuit chip including an output amplifier embodying the present invention.
FIG. 2 is a schematic circuit diagram of an alternate embodiment of a balanced variable gain direct coupled amplifier with a fixed DC output level embodying the principles of the present invention.

Referring to the drawings, and more particularly to FIG. 1, a functional block diagram of the complete integrated circuit chip indicated by the dotted outline 200 is shown, wherein angle modulated waves are introduced to the integrated circuit chip at terminals T2 and T3.

The integrated circuit chip 200 has a plurality of terminals T2–T18 located about its periphery for supplying inputs to and taking outputs from the chip. The frequency modulated waves (FM) are amplified and limited by the intermediate frequency (IF) amplifier-limiter 12 which may include several translating amplifier stages.

The limiting function of IF amplifier-limiter 12 serves to remove the amplitude modulation (AM) of the frequency modulated wave envelope. By way of example, the circuitry incorporated in the IF amplifier-limiter 12 of the integrated circuit chip 20 may be of the type described in a concurrently filed copending application Ser. No. 66,921 of Jack Avins (RCA 62,896), and assigned to the same assignee as the present invention.

Also arranged on the chip 200 is an angle modulation detector 14 which is coupled to an output of IF amplifier-limiter 12 to derive the modulation components from the amplified and limited wave and apply these components to an output amplifier 16. Although a single conductor is shown in FIG. 1 to couple the output amplifier 16 to the angle modulation detector 14, it is understood that two conductors may be used for a push-pull signal. The output signal from the output amplifier 16 is coupled to terminal T7 of chip 200 and applied to suitable utilization means not shown.

A second output signal from amplifier 16 is coupled to terminal T8 and provides an automatic frequency control (AFC) current which can be used to control the frequency of a local heterodyne oscillator, not shown, included in a signal wave receiver in which the integrated circuit chip 200 may be used.

Each translating amplifier stage of IF amplifier-limiter 12 is also coupled to a tuning and signal strength circuit 18 via conductors 260, 262, and 264. The tuning and signal strength circuit 18 is further coupled to an output of angle modulation detector 14, via conductor 368, and provides an AGC voltage at terminal T18, which may be coupled to a preceding RF of IF translating stage, not shown. An output voltage proportional to signal strength, for utilization by a tuning indicator, not shown, is also provided by the tuning and signal strength circuit 18 and is provided at terminal T16.

The hole detector circuit 20 is also coupled to the angle modulation detector 14 and provides a muting voltage at terminal T15 for utilization by an output amplifier.

By way of examples, the circuitry incorporated in the tuning and signal strength circuit 18 and in the hole detector circuit 20 may be of the types respectively described in concurrently filed copending applications Ser. No. 67,010 (RCA 62,897) and Ser. No 62,009 (RCA 62,900) of Jack Avins and Jack Craft filed Aug. 26, 1970, and assigned to the same assignee as this invention.

Also included on the integrated circuit chip 200 is the biasing power supply 22 which provides the bias voltages for proper operation of the IF amplifier-limiter 12, the angle modulation detector 14, the output amplifier 16, the tuning and signal strength circuit 18, and the hole detector circuit 20, from the potential applied at terminal T14. An example of the type of biasing power supply 22 that may be used may be found in copending patent application Ser. No. 67,010 (RCA 62,897) referred to above.

Figure 3:
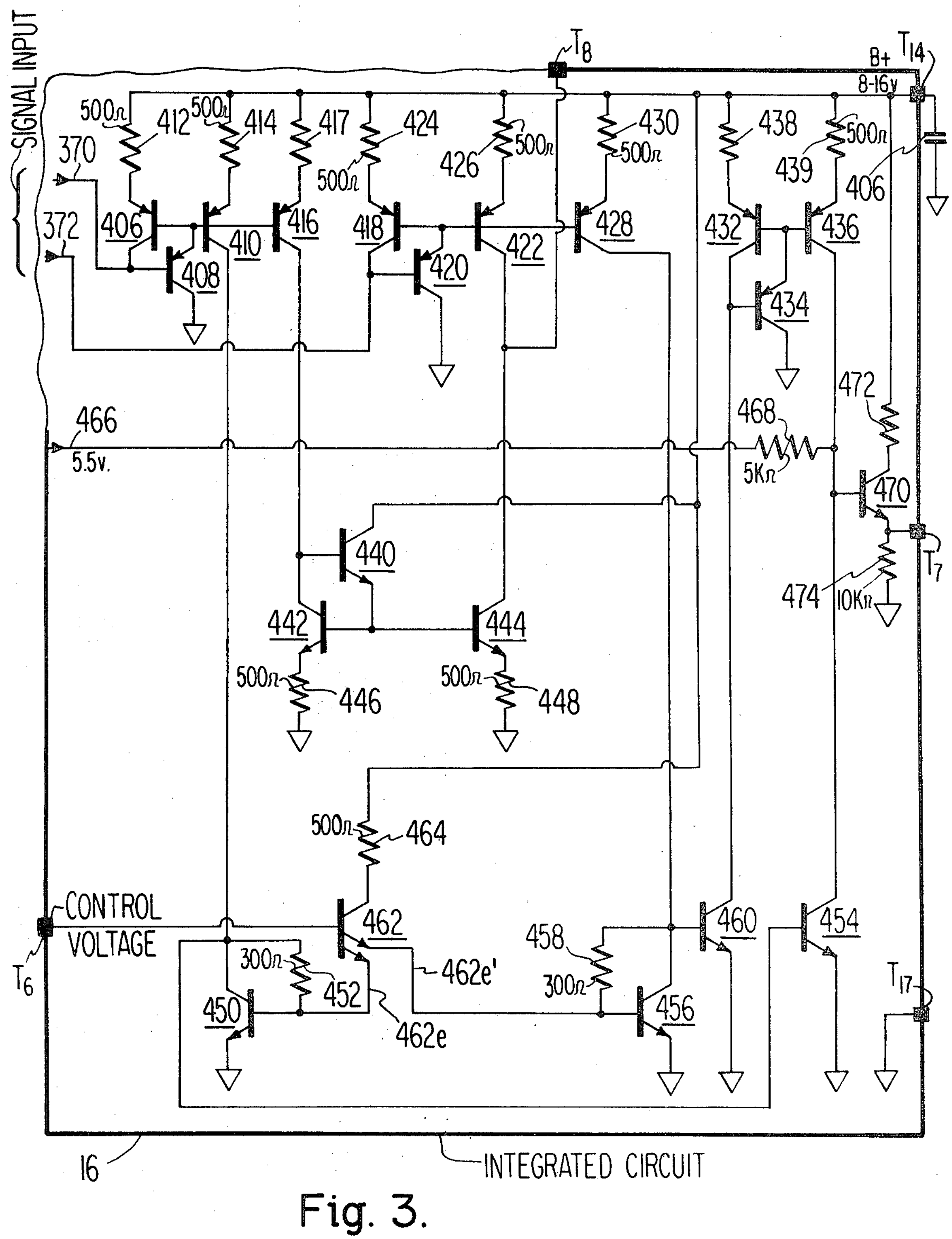
FIG. 3 is a schematic circuit diagram of the output amplifier shown in block form in FIG. 1, incorporating the principles of the present invention.

The schematic circuit diagram of the output amplifier 16, incorporating the principles of the present invention, and associated circuitry are shown in FIG. 3, which will be described hereinafter. However, a better initial understanding of the operation of an output amplifier which incorporates the principles of the present invention may be obtained by referring to an alternate embodiment of the invention shown in FIG. 2, which is a basic complementary balanced output amplifier appearing on an integrated circuit represented by the dotted lines 400.

The output stages of the basic complementary amplifier 400 include transistors 201 and 202 with attenuating transistors 204 and 206 connected across the emitter and base electrodes of the output transistors 201 and 202 respectively. The transistors 201 and 204 are both PNP semiconductor devices and transistors 202 and 206 are both NPN semiconductor devices. The current flowing in the attenuating transistors 204 and 206 is controlled by an attenuator control transistor 208, which is an NPN semiconductor device. Coupled to the collector electrodes of transistors 201 and 202 at terminal 225 may be an output emitter follower transistor 210, which functions as an impedance matching device and supplies the added current gain required to drive the output load, not shown, which may be coupled to terminal 226.

The input signal current to be translated is coupled to the base electrode of output transistor 201 at terminal 212. A DC bias current $I_o$ is also coupled to terminal 212 with the signal current. The collector electrode of attenuating transistor 204 is coupled to the base electrode of transistor 201 and the emitter electrode of transistor 204 is connected to a source of B+ at point 213. The emitter electrode of transistor 201 is also coupled to point 213.

A resistor 214 of a relatively low value (100 ohms) is coupled between the collector and base electrodes of transistor 204. The collector electrode of transistor 201 is coupled to the collector electrode of transistor 202 and to one end of a resistor 216. The other end of resistor 216 is coupled to terminal 219 which is adapted to be coupled to a constant or regulated source of DC voltage referred to as $E_o$.

The emitter electrode of transistor 202 is coupled to a ground reference terminal 221. The base electrode of transistor 202 is coupled to the collector electrode of transistor 206 and is coupled by resistor 218 to terminal 219. A resistor 220 of relatively low value, is coupled between the collector and base electrodes of transistor 206, while the emitter electrode of transistor 206 is coupled to the ground reference terminal 221. The base electrode of transistor 206 is coupled to the emitter electrode of transistor 208. The collector electrode of transistor 208 is coupled to the base electrode of transistor 204. The base electrode of transistor 208 is coupled to terminal 223, to which is applied the muting or control voltage.

The junction of the collector electrodes of transistors 201 and 202 and one side of resistor 216 also may be connected to the base electrode of emitter follower transistor 210. The collector electrode of transistor 210 is coupled by resistor 222 to terminal 213 and the emitter electrode of transistor 210 is coupled by resistor 224 to the ground reference terminal 221. The emitter electrode of transistor 210 is also coupled to output terminal 226.

The operation of the basic complementary balanced variable gain amplifier 400 shown in FIG. 2 is as follows: Resistor 218, coupled from terminal 219 ($E_o$) to the junction of the collector electrode of transistor 206 and the base electrode of transistor 202 is chosen according to the equation:

$$R_{218} = \frac{E_0 - V_{e-c_{206}}}{I_0}$$

so that a bias current $I_o$ will flow through it and be equal to the bias current $I_o$ flowing into terminal 212.

The circuit configuration of transistors 206 and 202 and resistors 218 and 220 comprise a variable gain amplifier circuit, and $I_o$ will also flow in the collector electrode of transistor 202 if no control voltage is applied to the base electrode of transistor 208 since transistor 208 is cut off. A variable gain amplifier circuit is further described in copending application Ser. No. 794,973 of Jack R. Harford, filed on Jan. 29, 1969, now U.S. Pat. No. 3,579,133 and assigned to the same assignee as the present invention.

With the same geometry used in the construction of transistors 201 and 204 and 202 and 206 respectively, the current flowing in the collector electrode of transistor 201 will flow in the collector electrode of transistor 202. An input signal wave having a signal current $I_s$ and a DC bias current $I_o$ coupled to terminal 212, will cause the current flow in collector electrode of transistor 201 to be the signal current $I_s$ plus the DC current $I_o$. With the circuit configuration, shown in the present embodiment of the invention, $I_o$ flows in both transistors 201 and 202, while transistor 201 has, in addition, the signal current $I_s$. Since there is a series current path including transistors 201 and 202 from terminal 213, the source of B+, to ground reference terminal 221, the signal current $I_s$ must flow through resistor 216 to the source of regulated DC ($E_o$) at terminal 219.

The bias current ($I_o$) does not flow through resistor 216; therefore, it does not cause any change in the DC voltage developed across resistor 216 and the DC voltage between the base electrode of transistor 210 and ground terminal 221 will remain fixed.

A control voltage applied to the base electrode of transistor 208, of the proper polarity such that transistor 208 is caused to conduct current, will cause transistors 204 and 206 to conduct current also. When transistors 204 and 206 conduct more current, they bypass the DC current normally flowing into the base electrodes of transistors 201 and 202, reducing their transconductance, and thus reduce the current flow in the series current path which includes the emitter and collector electrodes of transistors 201 and 202.

This reduction in current by a factor $k$ reduces the bias current ($I_o$) and the signal current ($I_s$) flowing in the collector electrode of transistor 201 and reduces the bias current ($I_o$) flowing in the collector electrode of transistor 202 by the same amount. However, the signal current $I_s$ being the only current flowing through resistor 216 is the only current contributing to the voltage drop across 216.

The base electrode of transistor 210 being coupled to the junction of the collector electrodes of transistors 201 and 202 at terminal 225 couples the changes in voltage (AC) appearing at this junction to a terminal 226 with current amplification. The voltage appearing between terminal 225 (the base electrode of transistor 210) and ground terminal 221 being equal to $V_o$ is:

$V_o = E_o + k \cdot I_s \cdot R_1$ where:

$E_o$ is the DC regulated voltage;

$k$ is the amount of attenuation introduced;

$I_s$ is the signal current; and $R_1$ is the load resistor (216).

Transistors 204 and 201, and 206 and 202, are matched transistor pairs so that the characteristics of each pair are essentially identical. The amount of attenuation introduced by transistor 204 is equal to the amount of attenuation introduced by transistor 206. With no control voltage or a negative voltage at the base electrode of transistor 208, no current flows in the emitter or collector electrodes of transistor 208 and transistors 204 and 206 are in a non-attenuating condition.

The attenuation factor ($k$) is thereby equal to unity and the output transistor stages 201 and 202 amplify with full gain. Increasing the voltage at the base electrode of transistor 208 is a positive direction increases the attenuation of the input signal $I_s$ by increasing the current flow in the emitter collector electrode of transistor 204, thereby lowering the transconductance of transistor 201.

Now, referring to FIG. 3, wherein the schematic circuit diagram of the output amplifier 16 which incorporates the principles of the present invention is shown, the FM signal wave coupled to points 370 and 372 from the output of the frequency modulation detector 14 (FIG. 1) is demodulated, but still contains frequency components of the carrier signal wave. Terminal T14 is adapted to be coupled to a source of B+ which may be from 8–16 volts DC. Terminal T14 is coupled externally to ground, via capacitor 406, which functions to filter the DC input voltage and bypass any external noise on the B+ line. Terminal T6 has the muting control voltage coupled to it from the hole detector 20 (FIG. 1) portion of the integrated circuit chip 200.

It is to be noted that the amplifier embodiment shown in FIG. 3 differs from the amplifier embodiment shown in FIG. 2 in that the amplifier shown in FIG. 2 has a single-ended input and uses an auxiliary or dummy bias current $I_o$ obtained from a separate current source. In addition, the circuit of FIG. 2 uses the collector and emitter currents of a single transistor 208 to control a PNP variable gain amplifier (transistors 201 and 204) and NPN variable gain amplifier (transistors 202 and 206) simultaneously, while the amplifier shown in FIG. 3 uses a current repeater (transistors 432, 434 and 436) to make possible the use of two NPN variable gain amplifiers (transistors 450 and 454, and 456 and 460). The NPN—NPN variable gain amplifiers of FIG. 3 can be made to track more closely than the NPN–PNP variable gain amplifiers of FIG. 2. Also, the embodiment shown in FIG. 3 does not require an auxiliary bias current $I_o$, since the push-pull outputs of the angle modulation detector 14 are utilized, e.g., $I_o + I_o$ and $I_o - I_s$ so that the output current signal is $2I_s$. The bias current $I_o$ is the operating current of the output stage of the angle modulation detector 14.

Referring again to FIG. 3, transistors 406, 408, 410 and 416 comprise one-half of the output load for the angle modulation detector 14 of FIG. 1, which has a balanced push-pull output, and are coupled between point 370 and terminal T14. The configuration of transistors 406, 408, 410 and 416 and resistors 412, 414, and 417 are known in the prior art as a current repeater circuit. The operation of this portion of the circuit will be explained hereinafter.

Transistors 418, 420, 422 and 428 and resistors 424, 426 and 430 coupled in a corresponding configuration to transistors 406, 408, 410 and 416, between point 372 and B+ (T14) and are the detector output load for the other side of the push-pull output of the angle modulation detector 14 (FIG. 1). Transistors 418, 420, 422 and 428 function in the same manner as transistors 406, 408, 410 and 416 as will be explained.

The operation of transistors 432, 434, 436 in cooperation with resistors 438 and 439 perform as a current repeater circuit as those mentioned earlier. The combination of transistors 440, 442, 444 and resistors 446 and 448 perform in the same manner.

The embodiment shown in FIG. 3, which utilizes the principles of the present invention, includes additional transistors which function as the load for the preceding stage, as noted above and in addition translate or repeat the signal currents at a proper voltage level for utilization by the variable gain amplifier transistors 450 and 454, and 456 and 460. Also included in the embodiment shown in FIG. 3 is emitter follower transistor 470, which couples the AC signal appearing at the junction of the collector electrodes of transistors 454 and 436 to output terminal T7.

Transistor 450 having resistor 452 connected between its collector and base electrodes in cooperation with transistor 454 functions as a variable gain amplifier or attenuator in order to attenuate the output current signal. Transistor 456 with resistor 458 coupled between its collector and base electrodes functions in the same manner as transistor 450 and resistor 452 and is a variable gain amplifier or attenuator. The variable gain amplifier which includes transistors 450 and 454 attenuates in the following manner. A current voltage which increases the DC current flow in the emitter and collector electrodes of transistor 450 bypasses DC current that would normally flow into the base electrode of transistor 454. The decrease in DC current flow into the base electrode of transistor 454 changes its operating point such that the transconductance (gm) of transistor 454 is reduced thereby reducing its gain. The operation of the variable gain amplifier is described more fully in copending application Ser. No. 794,973 mentioned above.

The control voltage to set the gain of the variable gain amplifier configuration comprised of transistors 450, 454 and 456, 460 is obtained from the emitter electrodes 462*e* and 462*e'* of transistor 462. Transistor 462 in the preferred embodiment of the invention has a dual emitter with the variable gain amplifier transistors as its load. The control voltage applied to terminal T6 is coupled to the base electrode of transistor 462. Transistor 462 responds to the control voltage appearing at T6 by conducting current into the base electrodes of transistors 450, 454, 456, and 460, thereby changing the DC current and gain of the variable gain amplifier transistors 450, 454 and 456, 460, which in turn changes the current flow in the current repeater comprised of transistors 432, 434 and 436.

Resistor 464 couples collector electrode of transistor 462 to B+ (terminal T14). Point 466 has a DC bias of approximately 5.5 volts coupled from the biasing power supply 22 (FIG. 1) which in turn is coupled through resistor 468 to the base electrode of emitter follower transistor 470 to provide a DC operating bias current.

The collector electrode of transistor 470 is coupled to terminal T14 by a resistor 472, which is a relatively small value (500 ohms). The emitter electrode of transistor 470 is coupled to terminal T17 (ground) by a resistor 474 which is a relatively large value (10k ohms). The emitter electrode of transistor 470 is also directly connected to terminal T7, which is the output of the integrated circuit chip.

The junction of the collector electrodes of transistors 422 and 444 is coupled to terminal T8 and provides the automatic frequency control (AFC) output current, which is unaffected by the action of the control voltage, since the currents flowing in the collector electrodes of transistors 422 and 444 are not a function of the currents flowing in the variable gain amplifier transistors 450, 454, 456, and 460. This insures the operation of the AFC circuit at full loop gain, even if the carrier wave is lost or interrupted for short intervals.

The current repeater circuit is a basic circuit configuration utilized several times in the audio output amplifier 16 and referred to above. It is generally comprised of three or more transistors and may include two or more resistors coupled substantially in a manner corresponding to the configuration of transistors 406, 408, 410 and 416 and resistors 412, 414, and 417 of FIG. 3.

The current repeater circuit configuration has the ability of substantially repeating the signal current impressed at the junction of the collector electrode of transistor 406 and the base electrode of 408 in the collector electrodes of transistors 410 and 416. Transistors 406, 408, 410 and 416 are preferably identical in geometry and fabricated in close proximity on the same monolithic integrated circuit substrate, thereby insuring similar characteristics. It is not necessary to maintain the transistor dimensions equal in this circuit configuration, but in the present embodiment of the invention and for the purpose of explaining the operation of the circuit the transistors' dimensions will be deemed equal.

The use of the emitter resistors 412, 414, in the present embodiment helps to insure equal current division, since the resistor values can be held to a closer tolerance by maintaining their dimensions, than the base-emitter junction areas of the transistors.

The operation of the repeater circuit may be described as follows: The signal current coupled via point 370 to the base electrode of transistor 408 is amplified by transistor 408 which functions as an emitter follower amplifier. The current flowing in the emitter electrode of transistor 408 will divide in three parallel paths; the base-emitter junction of transistor 406; the base-emitter junction of transistor 410; and the base-emitter junction of transistor 416, according to their relative reflected base input impedances.

With the base-emitter junctions of transistors 406, 410 and 416 having the same geometry their current densities and effective emitter resistances will be equal. The resistors 412, 414 and 417 having a value which is large compared to the effective emitter resistance of each transistor, being approximately 500 ohms, in the present embodiment, will cause the currents to divide equally. The amount of current that will flow in each of the collector electrodes of transistors 410 and 416 will be a function of the current appearing at the signal input point 370 and will be approximately equal to it.

The error introduced is small and is caused by the fact that the signal input current is the sum of the collector electrode current of transistor 406 plus the base electrode current of transistor 408. This small amount of base electrode current in transistor 408 is the emitter electrode current of transistor 408 divided by the current gain of transistor 408.

The emitter electrode current of transistor 408 is the sum of the three base electrode currents of transistors 406, 410, and 416, each of which in turn is small in magnitude, since it is the emitter electrode currents of transistors 406, 410 and 416 divided by the current gains of each of the respective transistors. Therefore, the collector electrode currents of transistors 410 and 416 being the emitter electrode currents less their respective base electrode currents are essentially equal to the input signal current and to each other. In addition, the collector electrode currents are not a function of B+, since they remain constant with respect to changes in B+.

It should be noted that all of the transistors just referred to are PNP transistors. Using PNP transistors in the present embodiment of the invention has the added advantage of eliminating the need for an integrating capacitor at the signal input points 370 and 372, since the PNP transistors have a relatively low alpha cut-off frequency, which is in the vicinity of 1 megahertz. These transistors integrate or effectively filter out the 4.5 or 10.7 megahertz components of the demodulated FM signal wave used in conventional TV or FM receivers. It is to be noted that 4.5 and 10.7 megahertz are merely illustrative and that the principles of the present invention are usable at higher frequencies.

In operation, the input signals between points 370 and 372 are 180° out of phase, since they are obtained from the push-pull output of the angle modulation detector 14 (FIG. 1). Since the detector output is zero at the center carrier frequency, no current flows through resistor 468 at the center frequency and no current will flow into or out of terminal T8, and the DC voltage at terminal T7 remains at the operating point set by resistor 468.

As the instantaneous signal frequency changes, assume an increasing signal current flowing into point 370 and a decreasing signal current flowing into point 372 (push-pull signal). The increased current will be repeated at the collector electrodes of transistors 410 and 416 as explained previously. The increasing signal current is also repeated at the collector electrode of transistor 444, since the configuration of transistors 440, 442 and 444 and resistors 446 and 448 form a repeating circuit of the type explained earlier. The decreasing signal current coupled to point 372 is repeated at the collector electrodes of transistors 422 and 428.

The collector electrodes of transistors 422 and 444 are connected together, forming a complementary output amplifier, and are coupled to external terminal T8. The current into terminal T8 will vary from zero at the center frequency of detector 14 to a positive or negative value on either side of the center frequency. This current is used to control the frequency of the oscillator, (AFC) located elsewhere, to the center frequency.

The decreasing signal current flowing in transistor 428 as noted above is coupled to the input base electrode of the variable gain amplifier circuit comprised of transistors 456, 460 and resistor 458 and is duplicated in the collector electrode of transistor 436. The operation of this circuit is explained in greater detail, as mentioned earlier, in copending application Ser. No. 794,973. The gain of the variable gain amplifier circuit (transistors 456, 460 and resistor 458) is determined by the DC control voltage appearing at the base electrode of transistor 456.

The increasing signal current flowing in the collector electrode of transistor 410 as noted above is coupled to the variable gain amplifier comprised of transistors 450, 454, and resistor 452. The gain of the variable gain amplifier circuit (transistors 450, 454 and resistor 452) is determined, as before, by the DC control voltage appearing at the base electrode of transistor 450. The base electrodes of transistors 456 and 450 are coupled to emitter follower transistor 462 which has a double emitter electrode area **462*e* and 462*e*', each base electrode of transistors 450 and 456** being coupled to one emitter junction.

The muting control voltage appearing at terminal T6 is coupled to the base electrode of transistor 462, will vary the gains of both sections of the variable gain amplifier in exactly the same manner, simultaneously. With the mute signal bias held constant, the decreasing signal current flowing in the collector electrode of transistor 460, as noted above, is coupled to the current repeater circuit configuration comprised of transistors 432, 434, 436 and resistors 438 and 439 where the decreasing signal current is repeated in the collector electrode of transistor 436. Transistors 436 and 454 have their respective collector electrodes connected together to function as a conventional complementary output amplifier.

The decreasing signal current in the collector electrode of transistor 436 and the increasing signal current flowing in the collector electrode of transistor 454 causes twice the differential current to flow through resistor 468, and causes the voltage at the base electrode of transistor 470, functioning as an emitter follower amplifier, to move more negative than the reference voltage at point 466 (5.5v).

Conversely, an increasing signal current flowing in the collector electrode of transistor 436 and a decreasing signal current flowing in the collector electrode of transistor 454 will cause the voltage at base electrode of transistor 470 to move more positive than the reference voltage at point 466.

With no signal current flowing in collector electrodes of transistors 454 and 436 and only equal bias currents flowing, the current flow in resistor 468 is zero and the voltage at the base electrode of transistor 470 would be the same as that appearing at point 466, which in the present embodiment of the invention is approximately 5.5v volts. The voltage appearing at the emitter electrode of transistor 470 is coupled to terminal T7, which is the output terminal. This output voltage can be coupled to a utilization means, e.g., an audio preamplifier, a stereo decoder circuit, since the output signal contains all the demodulated signal information up to approximately 1 megahertz.

Excellent balance and a high signal-to-noise ratio, as the signal is attenuated over more than a 40db range, is obtained by the use of the preferred embodiment of the present invention. Output transistors 436 and 454 are cut off as the attenuation increases so that their collector current does not contribute noise to the output signal. In addition, the output signal voltage is independent of the value of the main B+ supply voltage as long as the reference voltage $V_o$ is kept fixed. It is also to be noted that the overall gain of the amplifier may be adjusted by varying load resistor 468 without changing the output DC level.

What is claimed is:

1. A variable gain amplifier comprising:

first and second terminals adapted to be connected to a source of operating potential;

first and second transistors, each having emitter, base, and collector electrodes; the emitter-collector current paths of said first and second transistors having a common connection and being connected in series between said first and second terminals;

means coupled to the base electrodes of said first and second transistors for coupling substantially equal bias currents thereto and for coupling signals to be translated to at least said first transistor;

means including a source of voltage and a load impedance coupled to said common connection of said first and second transistors for providing a substantially fixed DC quiescent voltage; and gain control means, coupled across the base and emitter electrodes of each said first and second transistors, responsive to control signals for varying the amplitude of said translated signals while maintaining said fixed DC voltage at said common connection.

2. A variable gain amplifier according to claim 1 wherein said control means comprises:

third and fourth transistors, each having emitter, base, and collector electrodes, the emitter and collector electrodes of said third and fourth transistors being coupled to the emitter and base electrodes respectively of said first and second transistors;

first and second resistors coupled between the collector and base electrodes of said third and fourth transistors, respectively;

a fifth transistor, having emitter, base, and collector electrodes, the collector electrode of said fifth transistor being coupled to the base electrode of said third transistor, the emitter electrode of said fifth transistor being coupled to the base electrode of said fourth transistor; and means for applying gain control signal to the base electrode of said fifth transistor.

3. A variable gain amplifier according to claim 1 wherein said control means comprises:

third and fourth transistors, each having emitter, base, and collector electrodes, the emitter and collector electrodes of said third and fourth transistors being coupled to the emitter and base electrodes, respectively, of said first and second transistors;

first and second resistors coupled between the collector and base electrodes of said third and fourth transistors, respectively; and means coupled to said base electrodes of said third and fourth transistors for applying like gain control signals thereto to vary the gain of said first and second transistors.

4. A variable gain amplifier according to claim 3 wherein said first and third transistors are semiconductors of one type and said second and fourth transistors are semiconductors of another type.

5. A variable gain amplifier comprising:

first and second terminals adapted to be connected to a source of operating potential;

first and second transistors, each having emitter, base, and collector electrodes, the emitter electrodes of said first and second transistors being coupled to said second terminal, the collector electrode of said first transistor being coupled to a means for supplying a fixed DC operating point voltage;

means coupled to the base electrodes of said first and second transistors for applying push-pull signals to be translated therethrough;

means having an input and an output terminal, coupled between the collector electrode of said second transistor and said first terminal, for repeating the current flowing in the collector electrode of said second transistor, the input terminal of said current repeating means being coupled to the collector electrode of said second transistor, said output terminal of said current repeating means being coupled to the collector electrode of said first transistor; and control means, coupled across the base and emitter electrodes of each said first and second transistors, responsive to a control signal for varying the gain of said first and second transistors to control the amplitude of said translated signals while maintaining said fixed DC operating point voltage.

6. A variable gain amplifier according to claim 5 wherein said means for repeating the current flowing in the collector electrode of said second transistor comprises third, fourth, and fifth transistors, each having emitter, base, and collector electrodes, the base electrodes of said fourth and fifth transistors being jointly connected to the emitter electrode of said third transistor, the emitter electrode of said fourth and fifth transistors each being coupled to said first terminal, the collector electrode of said fourth transistor being coupled to the base electrode of said third transistor and coupled to the collector electrode of said second transistor, the collector electrode of said third transistor being coupled to said second terminal, the collector electrode of said fifth transistor being coupled to the collector electrode of said first transistor.

7. A variable gain amplifier according to claim 5 wherein said first and second transistors are semiconductor devices of the same type.

8. A variable gain amplifier according to claim 5 wherein said control means comprises:

third and fourth transistors, each having emitter, base, and collector electrodes, the emitter and collector electrodes of said third and fourth transistors being coupled to the emitter and base electrodes respectively of said first and second transistors;

first and second resistors coupled between the collector and base electrodes of said third and fourth transistors, respectively;

a fifth transistor, having a first and second emitter, base, and collector electrodes, the collector electrode of said fifth transistor being coupled to said second terminal, the first emitter electrode of said fifth transistor being coupled to the base electrode of said third transistor, the second emitter electrode of said fifth transistor being coupled to the base electrode of said fourth transistor; and means for applying a DC gain control signal to the base electrode of said fifth transistor.

9. A variable gain amplifier according to claim 5 wherein said control means comprises:

third and fourth transistors each having emitter, base and collector electrodes, the emitter and collector electrodes of said third and fourth transistors being coupled to the emitter and base electrodes, respectively, of said first and second transistors;

first and second resistors coupled between collector and base electrodes of said third and fourth transistors, respectively; and means coupled to said base electrodes of said third and fourth transistors for supplying like direct-current control signals to said last-named base electrodes to vary the gain of said first and second transistors.

10. A variable gain amplifier according to claim 9 wherein said current repeating means comprises fifth and sixth transistors, each having emitter, base and collector electrodes, said base electrodes of said fifth and sixth transistors being direct current coupled to the collectors of said second and fifth transistors, said emitter of said fifth and sixth transistors being direct current coupled to said first terminal, and said collector electrode of said sixth transistor being coupled to said output terminal.

11. A variable gain amplifier according to claim 5 wherein said first and second transistors and said control means includes semiconductors of one type.

* * * * *

UNITED STATES PATENT OFFICE
CERTIFICATE OF CORRECTION

Patent No. 3,678,403 Dated July 18, 1972

Inventor(x) Jack (NMN) Craft

It is certified that error appears in the above-identified patent and that said Letters Patent are hereby corrected as shown below:

Column 1, line 52, "(2,898)" should read -- (62,898) --. Column 2, line 45, "Serial No. 62,009" should read -- Serial No. 67,009 --. Column 4, line 50, "is a positive" should read -- in a positive --. Column 5, line 10, "$I_o+I_o$" should read -- $I_o+I_s$ --.

Signed and sealed this 13th day of February 1973.

(SEAL)
Attest:

EDWARD M.FLETCHER,JR.
Attesting Officer

ROBERT GOTTSCHALK
Commissioner of Patents